United States Patent
Furukawa

(10) Patent No.: US 7,301,359 B2
(45) Date of Patent: Nov. 27, 2007

(54) TESTING APPARATUS, AND TESTING METHOD

(75) Inventor: Yasuo Furukawa, Tokyo (JP)

(73) Assignee: Advantest Corporation, Tokyo (JP)

(*) Notice: Subject to any disclaimer, the term of this patent is extended or adjusted under 35 U.S.C. 154(b) by 35 days.

(21) Appl. No.: 11/418,576

(22) Filed: May 5, 2006

(65) Prior Publication Data
US 2006/0255828 A1    Nov. 16, 2006

(30) Foreign Application Priority Data
May 11, 2005    (JP) ............................. 2005-138065

(51) Int. Cl.
*G01R 31/26* (2006.01)
*G01R 31/28* (2006.01)
*G01R 31/02* (2006.01)

(52) U.S. Cl. .................. 324/765; 324/763; 324/760; 324/754

(58) Field of Classification Search ......... 324/754–765
See application file for complete search history.

(56) References Cited

U.S. PATENT DOCUMENTS

| | | | |
|---|---|---|---|
| 6,400,173 B1* | 6/2002 | Shimizu et al. ............ | 324/765 |
| 7,183,784 B2* | 2/2007 | Maggi et al. ............... | 324/760 |
| 2002/0186031 A1* | 12/2002 | Pelissier ..................... | 324/760 |
| 2006/0164111 A1* | 7/2006 | Lopez et al. ................ | 324/760 |
| 2006/0250152 A1* | 11/2006 | Rius Vazquez et al. ..... | 324/765 |

* cited by examiner

Primary Examiner—Ha Tran Nguyen
Assistant Examiner—Emily Y Chan
(74) Attorney, Agent, or Firm—Osha Liang LLP

(57) ABSTRACT

Here is provided a testing apparatus for judging whether or not a device-under-test is defect-free based on static power-supply current of the device-under-test, having a power supply for supplying power for driving the device-under-test to the device-under-test, a pattern generating section for supplying setting vectors for setting a circuit of the device-under-test into a predetermined state to the device-under-test, a power-supply current measuring section for measuring the static power-supply current supplied from the power supply to the device-under-test when the device-under-test is set into the predetermined state by the setting vectors and a judging section for obtaining temperature of the device-under-test from a temperature sensor provided within the device-under-test to judge whether or not the device-under-test is defect-free based on the static power-supply current measured by the power-supply current measuring section and the temperature of the device-under-test.

4 Claims, 11 Drawing Sheets

TESTING APPARATUS, AND TESTING METHOD

CROSS REFERENCE TO RELATED APPLICATION

The present application claims priority from a Japanese Patent Application(s) No. 2005-138065 filed on May 11, 2005, the contents of which are incorporated herein by reference.

BACKGROUND OF THE INVENTION

1. Field of the Invention

The present invention relates to a testing apparatus and a testing method for testing a device-under-test such as a semiconductor circuit. More specifically, the invention relates to a testing apparatus and a testing method for judging whether or not the device-under-test is defect-free based on its static power-supply current.

2. Related Art

Conventionally, there has been known a method of detecting an abnormal value of power-supply current by measuring the power-supply current supplied to a device-under-test test such as a semiconductor circuit as a method for testing the device-under-test. For example, it is judged whether or not a device-under-test is defect-free by applying various test patterns to the device-under-test, by detecting power-supply current of the device-under-test when it is in various operation states and by judging whether or not the power-supply current falls within a predetermined range.

However, due to refinement of a device-under-test and increase of a number of CMOSs contained in the device-under-test of recent years, leak current in such device-under-test is increasing. The leak current fluctuates depending on variation per device-under-test, temperature change and others. Specifically, so-called sub-threshold leak current in COMS largely depends on temperature, so that it is difficult to stabilize such leak current. Therefore, the conventional power-supply current test has had problems that the power-supply current supplied to the device-under-test fluctuates due to the fluctuation of the leak current and that the device-under-test is judged to be defective even if it ought to be judged to be defect-free.

SUMMARY OF THE INVENTION

Accordingly, it is an object of the invention to provide a testing apparatus and a testing method that are capable of solving the above-mentioned problems. This object may be achieved through the combination of features described in independent claims of the invention. Dependent claims thereof specify preferable embodiments of the invention.

That is, according to a first aspect of the invention, there is provided a testing apparatus for judging whether or not a device-under-test is defect-free based on static power-supply current of the device-under-test, having a power supply for supplying power for driving the device-under-test to the device-under-test, a pattern generating section for supplying setting vectors for setting a circuit of the device-under-test into a predetermined state to the device-under-test, a power-supply current measuring section for measuring the static power-supply current supplied from the power supply to the device-under-test when the device-under-test is set into the predetermined state by the setting vectors and a judging section for obtaining temperature of the device-under-test from a temperature sensor provided within the device-under-test to judge whether or not the device-under-test is defect-free based on the static power-supply current measured by the power-supply current measuring section and the temperature of the device-under-test.

The judging section may have an expected value storage section for storing expected values of the static power-supply current given per temperature of the device-under-test and a comparing section for judging whether or not the device-under-test is defect-free by comparing the measured static power-supply current with the expected value corresponding to the temperature of the device-under-test when the static power-supply current is measured.

The judging section may have an expected value storage section for storing expected values of the static power-supply current at temperature set in advance, a correcting section for correcting the measured static power-supply current to a current value obtained when measured at the temperature set in advance based on the temperature of the device-under-test when the static power-supply current is measured and a comparing section for judging whether or not the device-under-test is defect-free by comparing the current value calculated by the correcting section with the expected value.

According to a second aspect of the invention, there is provided a testing method for judging whether or not a device-under-test is defect-free based on static power-supply current of the device-under-test, having a power supplying step of supplying power for driving the device-under-test to the device-under-test, a pattern generating step of supplying setting vectors for setting a circuit of the device-under-test into a predetermined state to the device-under-test, a power-supply current measuring step of measuring the static power-supply current supplied from the power-supply to the device-under-test when the device-under-test is set into the predetermined state by the setting vectors and a judging step of obtaining temperature of the device-under-test from a temperature sensor provided within the device-under-test to judge whether or not the device-under-test is defect-free based on the static power-supply current measured in the power-supply current measuring step and the temperature of the device-under-test.

It is noted that the summary of the invention described above does not necessarily describe all necessary features of the invention. The invention may also be a sub-combination of the features described above.

DETAILED DESCRIPTION OF THE INVENTION

The invention will now be described based on preferred embodiments, which do not intend to limit the scope of the invention, but exemplify the invention. All of the features and the combinations thereof described in the embodiments are not necessarily essential to the invention.

Figure 1:
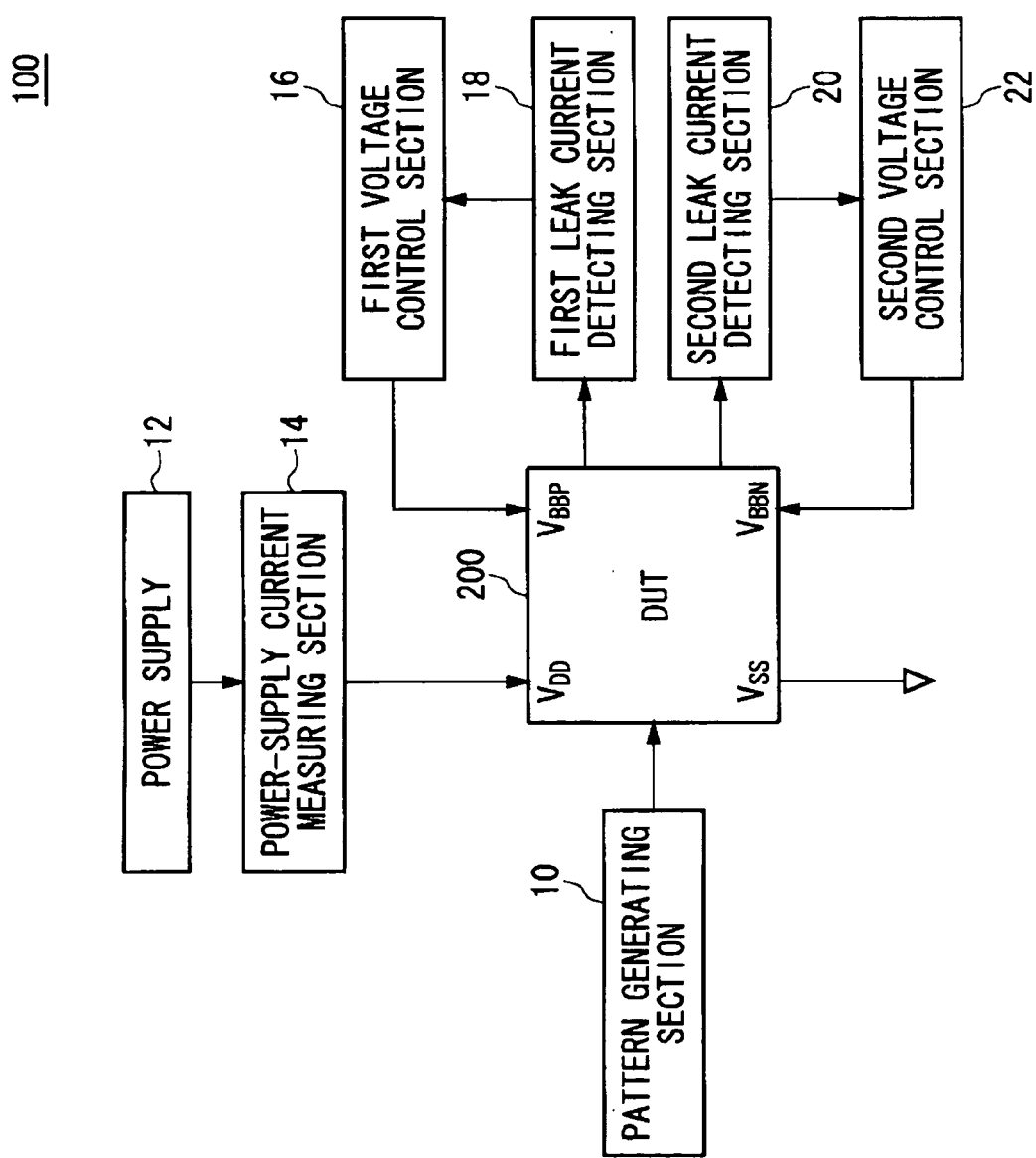
FIG. 1 is a diagram showing one exemplary configuration a testing apparatus 100.

FIG. 1 is a diagram showing one exemplary configuration a testing apparatus 100. The testing apparatus 100 is an apparatus for testing a device-under-test 200 in which field effect transistors are provided and has a pattern generating section 10, a power supply 12, a power-supply current measuring section 14, a first voltage control section 16, a first leak current detecting section 18, a second leak current detecting section 20 and a second voltage control section 22. The field effect transistor refers to a MOS type field effect transistor in this example.

The power supply 12 supplies power for driving the device-under-test 200. The power supply 12 supplies power of constant voltage to the device-under-test 200 in this example. The pattern generating section 10 sequentially generates and supplies a plurality of test patterns to be supplied to the device-under-test 200. That is, the pattern generating section 10 causes different operation states in the device-under-test 200 by supplying the different test patterns sequentially to the device-under-test 200. Then, every time when each test pattern is applied, the power-supply current measuring section 14 detects the power-supply current supplied from the power supply 12 to the device-under-test 200. The power-supply current measuring section 14 may detect power-supply current (IDDQ) when the device-under-test 200 is static.

The first and second leak current detecting sections 18 and 20 detect leak current of the field effect transistors contained in the device-under-test 200. In the present embodiment, the first leak current detecting section 18 detects sub-threshold leak current per unit number of p-type field effect transistors contained in the device-under-test 200 and the second leak current detecting section 20 detects sub-threshold leak current per unit number of n-type field effect transistors contained in the device-under-test 200. The sub-threshold leak current is leak current flowing between channels of the field effect transistor.

The first and second voltage control sections 16 and 22 control substrate voltage applied to a substrate of the device-under-test 200 so that the leak current detected by the first and second leak current detecting sections 18 and 20 is kept at a predetermined value. That is, the voltage control sections control the substrate voltage corresponding to fluctuation of the leak current. Here, the substrate refers to a semiconductor substrate on which semiconductor devices such as the field effect transistors are formed.

Normally, first voltage (high voltage) is applied to an n-type substrate of the substrate of the device-under-test 200 and second voltage (low voltage) lower than the first voltage is applied to a p-type region (p-well). In the present embodiment, the first voltage control section 16 controls the first voltage applied to the n-type substrate of the substrate of the device-under-test 200 so that the leak current detected by the first leak current detecting section 18 becomes constant. Thereby, the leak current of the n-type field effect transistors of the device-under-test 200 is controlled to be constant.

The second voltage control section 22 controls the second voltage applied to the p-type region of the substrate of the device-under-test 200 so that the leak current detected by the second leak current detecting section 20 becomes constant. Thus, the leak current of the n-type field effect transistors of the device-under-test 200 is controlled to be constant.

Through such operation, the leak current of the field effect transistors contained in the device-under-test 200 is controlled to be constant during when the pattern generating section 10 inputs the plurality of test patterns to the device-under-test 200. Then, the power-supply current measuring section 14 judges whether or not the device-under-test 200 is defect-free based on a value of the power-supply current measured per every test pattern. For example, the power-supply current measuring section 14 lines up values of the power-supply currents measured with respect to the respective test patterns in order from one having a larger value to calculate a difference from a neighboring value of power-supply current and judges that the device-under-test 200 is defective if there is a value greater than a value set in advance among the calculated values of difference.

The testing apparatus 100 of the present embodiment allows the device-under-test 200 to be accurately judged whether or not it is defect-free by eliminating the fluctuation of the sub-threshold leak current of the field effect transistors contained in the device-under-test 200.

Figure 2:
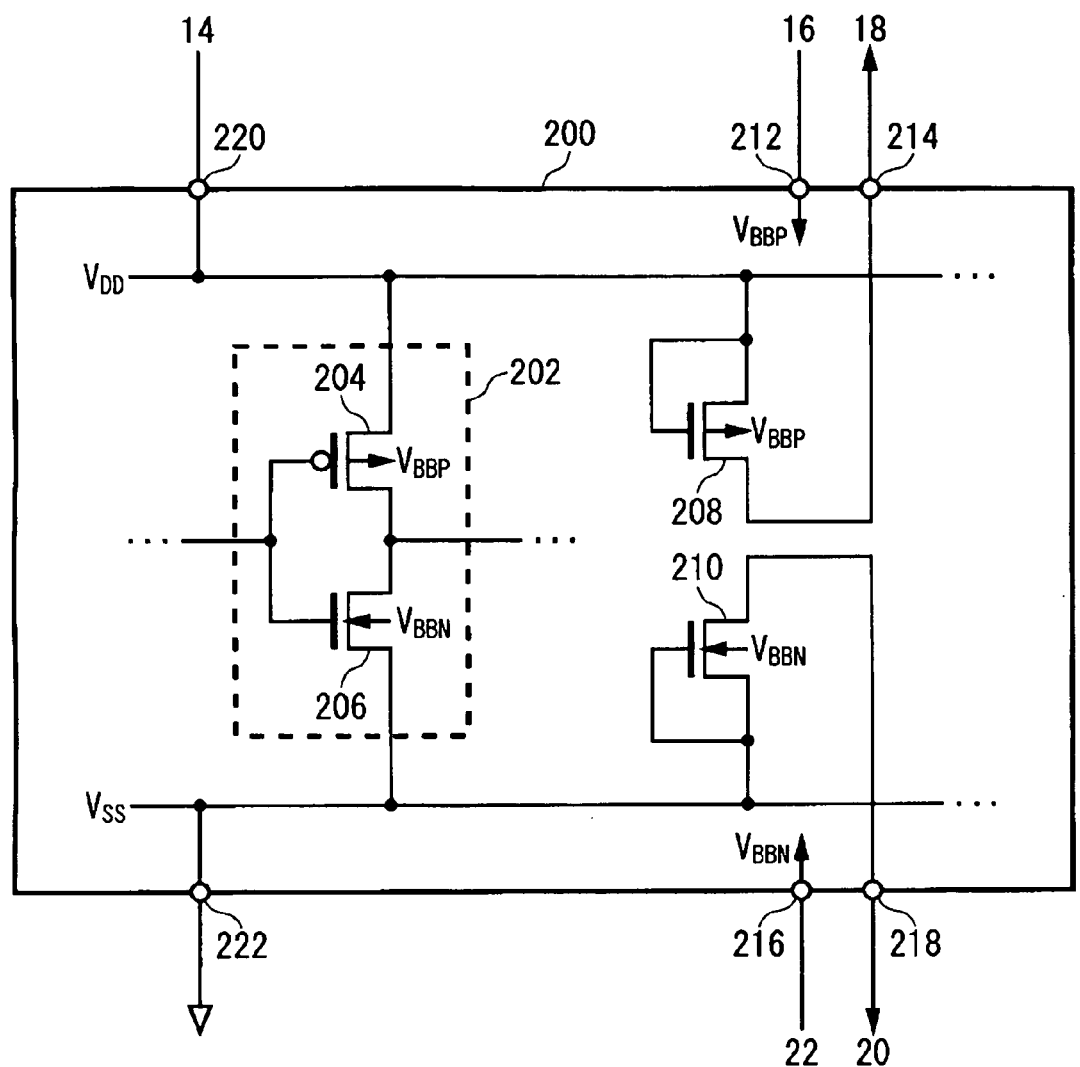
FIG. 2 is a diagram showing one exemplary configuration of a device-under-test 200.

FIG. 2 is a diagram showing one exemplary configuration of the device-under-test 200. The device-under-test 200 has a circuit section-under-test 202 that operates corresponding to the given test patterns, a p-type dummy transistor 208, an n-type dummy transistor 210, power-supply terminals (220 and 222), substrate voltage terminals (212 and 216) and leak current detecting terminals (214 and 218).

Power-supply voltage $V_{DD}$ is applied to the power-supply terminal 220 from the power supply 12 via the power-supply current measuring section 14. Power-supply voltage $V_{SS}$ is applied to the power-supply terminal 222. The power-supply terminal 222 is grounded in the present embodiment.

The substrate voltage terminals (212 and 216) are provided independently of the power-supply terminals (220 and 222). Voltage ($V_{BBP}$) outputted out of the first voltage control section 16 is applied to the substrate voltage terminal 212 and voltage ($V_{BBN}$) outputted out of the second voltage control section 22 is applied to the substrate voltage terminal 216. It becomes possible to control the substrate voltage of the device-under-test 200 by proving the power-supply terminals and the substrate terminals independently from each other as described above.

The circuit section-under-test 202 is provided between a power-supply line ($V_{DD}$) and a power-supply line ($V_{SS}$) and power of the power supply is supplied thereto. The power-supply voltage $V_{DD}$ is applied to the power-supply line ($V_{DD}$) via the power-supply terminal 220. Voltage lower than that of the power-supply line ($V_{DD}$) is applied to the power-supply line ($V_{SS}$). The power-supply line ($V_{SS}$) is grounded via the power-supply terminal 222 in the present embodiment. A plurality of p-type field effect transistors 204 and a plurality of n-type field effect transistors 206 are provided within the circuit section-under-test 202. A signal corresponding to a test pattern given to the device-under-test 200 is given to a gate terminal of the respective field effect transistors 204 and 206, that consume power-supply current corresponding to their state of operation.

The p-type dummy transistor 208 is formed so as to have almost same characteristics with the p-type field effect transistor 204 provided in the device-under-test 200 and almost equal power-supply current with that of the p-type field effect transistor 204 is applied thereto. The power-supply voltage $V_{DD}$ is applied to a source terminal of the p-type dummy transistor 208 in the present embodiment.

The n-type dummy transistor 210 is formed so as to have almost same characteristics with the n-type field effect transistor 206 provided in the device-under-test 200 and almost equal power-supply voltage with that of the n-type field effect transistor 206 is applied thereto. The power-supply voltage $V_{SS}$ is applied to a source terminal of the n-type dummy transistor 210 in the present embodiment.

The gate terminal and the source terminal of the respective dummy transistors 208 and 210 are short-circuited and drain current is outputted to the outside. The p-type dummy transistor 208 outputs the drain current to the first leak current detecting section 18 via the leak current detecting terminal 214. The n-type dummy transistor 210 outputs the drain current to the second leak current detecting section 20 via the leak current detecting terminal 218. The respective dummy transistors 208 and 210 are provided independently of an input pin (not shown) through which the test pattern is inputted.

Because the dummy transistors 208 and 210 and the field effect transistors 204 and 206 have almost the same characteristics and the almost equal power-supply voltage and substrate voltage are applied thereto, the drain current outputted out of the dummy transistors 208 and 210 is almost equal with the leak current in the corresponding field effect transistors 204 and 206. That is, the respective dummy transistors 208 and 210 function as a leak current detecting circuit in the present invention.

Such configuration enables the testing apparatus 100 to detect the value of the leak current per unit number of the field effect transistors provided in the device-under-test 200. Then, the testing apparatus 100 can keep the leak current in the field effect transistors contained in the device-under-test 200 constant by controlling substrate voltage of the device-under-test 200 based on the leak current. Therefore, the testing apparatus 100 can accurately detect the power-supply current by sequentially supplying the test patterns while making the control described above and by measuring the power-supply current.

While the device-under-test 200 has one pair of dummy transistors 208 and 210 in this example, the device-under-test 200 may have a plurality of pairs of dummy transistors 208 and 210 in another case. For example, its possible to provide the dummy transistors 208 and 210 so as to almost homogeneously distribute in the substrate. In this case, the first and second leak current detecting sections 18 and 20 may calculate an average value of currents outputted out of the plurality of dummy transistors 208 and 210.

The device-under-test 200 is manufactured by a device manufacturing method having a preparation step of preparing the substrate of the device-under-test 200, a circuit forming step of forming the field effect transistors 204 and 206 on the substrate and a detecting circuit forming step of forming the dummy transistors 208 and 210 that output almost equal current with the leak current of the field effect transistors 204 and 206 to the outside on the substrate. The device manufacturing method may further include a step of forming the power-supply terminals 220 and 222, the substrate voltage terminals 212 and 216 and the leak current detecting terminals 214 and 218 described above.

Figure 3A:
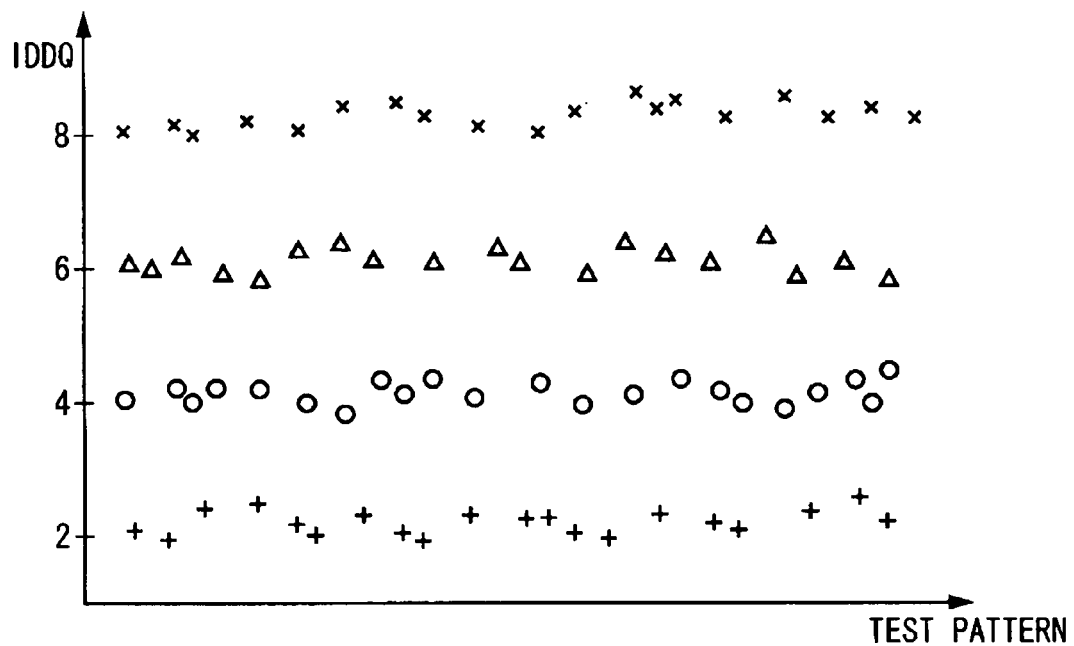
FIG. 3A is a graph showing one exemplary value of power-supply current measured per test pattern sequentially supplied to the device-under-test 200.
Figure 3B:
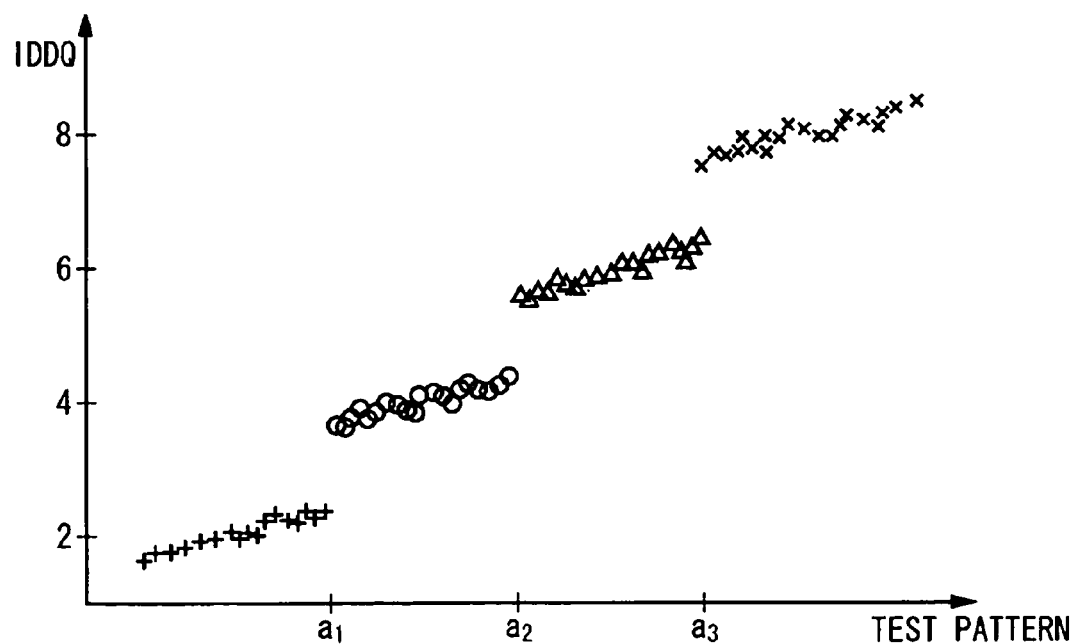
FIG. 3B is a graph showing the measured values of power-supply current lined up in order from those having a smaller value.

FIGS. 3A and 3B are graphs showing exemplary power-supply current values measured per every test pattern supplied to the device-under-test 200. In FIG. 3, an axis of abscissa represents the test patterns supplied to the device-under-test 200 and an axis of ordinate represents values of the measured power-supply currents.

FIG. 3A shows the values of the power-supply current per test pattern sequentially supplied. The power-supply current measuring section 14 measures the power-supply current corresponding to the operation state of the device-under-test 200 per every test pattern as shown in FIG. 3A. At this time, the pattern generating section 10 generates the plurality of test patterns so that a number of field effect transistors, which turn on, sequentially changes among the plurality of field effect transistors contained in the device-under-test 200 per every test pattern. For example, the pattern generating section 10 generates the respective test patterns so that the number of field effect transistors which turn on increases by each unit number set in advance. In FIG. 3A, the axis of abscissa represents the test patterns arrayed in order supplied to the device-under-test 200 for example. Then, the power-supply current measuring section 14 lines up the measured power-supply currents in order from one whose value is smaller.

FIG. 3B is a graph showing the measured values of power-supply current lined up in order from one whose value is smaller. When the number of field effect transistors which turn on is different by unit number each per test pattern, the lined up measured values of the power-supply current is approximated by a straight line. However, when the device-under-test 200 is defective, the lined up measured values of the power-supply current become discontinuous as shown in FIG. 3B. The power-supply current measuring section 14 detects a discontinuous part in the lined up measured values of the power-supply current to detect defects of the device-under-test 200. For example, the power-supply current measuring section 14 detects the discontinuous part by second-order differentiating a waveform of the lined up values of power-supply current and by detecting a peak of the differential value.

Figure 4:
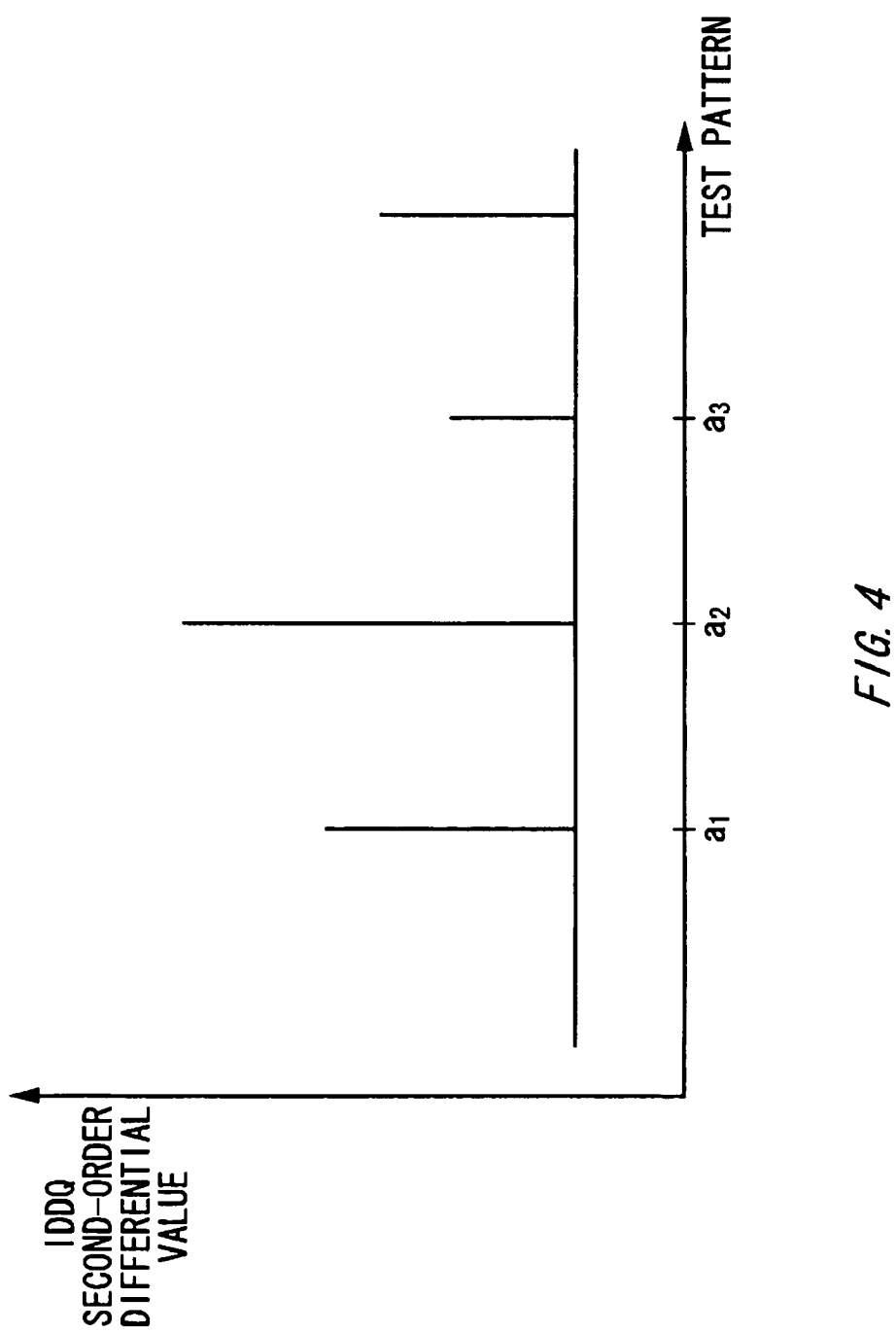
FIG. 4 is a graph showing one exemplary result of a second-order differentiated waveform of the lined up power-supply current.

FIG. 4 is a graph showing one exemplary result of the second-order differentiated waveform of the lined up power-supply current. As shown in FIG. 4, the peaks of the second-order differential value appear at parts where the measured value of the power-supply current is discontinuous. The power-supply current measuring section 14 may judge that the device-under-test 200 is defective when the value of those peaks exceeds a reference value set in advance.

Because it takes a long period of time to measure the power-supply current with respect to a large number of test patterns, the power-supply current measuring section 14 may measure the power-supply current for a smaller number of test patterns and to judge whether or not the device-under-test 200 is defect-free based on measured values of such power-supply current to shorten the measuring time.

In this case, the power-supply current measuring section 14 approximates the lined up measured values of power-supply current by a straight line by a means of a method of least square for example. Then, the power-supply current measuring section 14 may judge that the device-under-test 200 is defect-free when a degree of coincidence of the approximated straight line with the measured values of the power-supply current is greater than a predetermined value. When the degree of coincidence of the approximated straight with the measured values of the power-supply current is less than the predetermined value, the power-supply current measuring section 14 may divide the measured values of the power-supply current and to approximate the measured values of the power-supply current to a straight line in each region thus divided.

Then, the power-supply current measuring section 14 may calculate the degree of coincidence of the approximated straight line with the measured values of the power-supply current in each divided region. Still more, the power-supply current measuring section 14 may compare inclination of straight lines approximated in the respective divided regions to judge that the device-under-test 200 is defective when a difference of inclinations exceeds a predetermined value.

Figure 5:
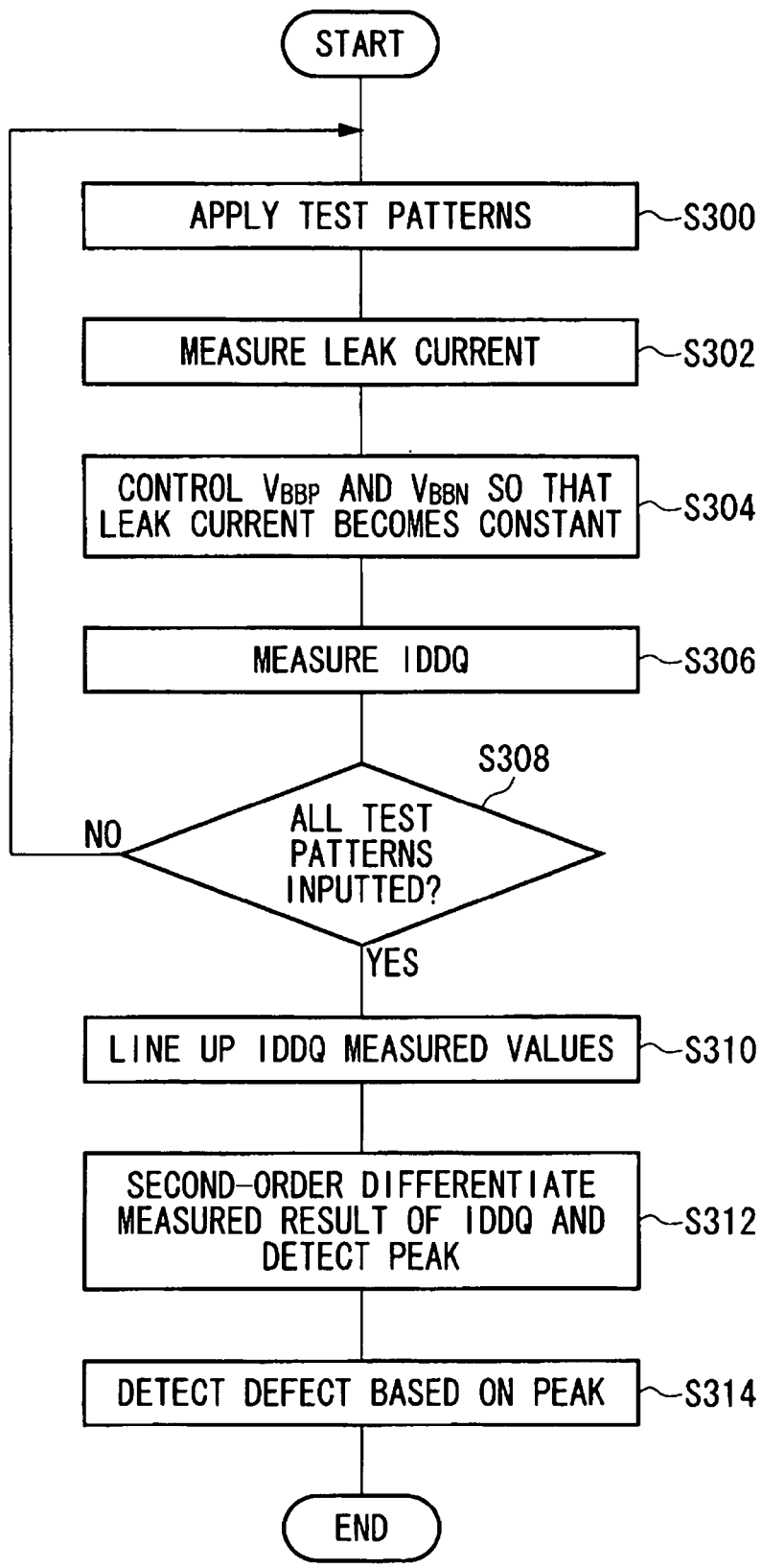
FIG. 5 is a flowchart showing one exemplary testing method for testing the device-under-test 200 according an embodiment of the invention.

FIG. 5 is a flowchart showing one exemplary testing method for testing the device-under-test 200 according an embodiment of the invention. The device-under-test 200 may be tested by this method in the same manner with the method explained in FIGS. 1 through 4.

At first, power for driving the device-under-test 200 is supplied in a power supplying step. Then, the test patterns to be supplied to the device-under-test 200 are generated and supplied in a pattern generating step S300.

The leak current in the field effect transistors contained in the device-under-test 200 is detected in a leak current measuring step S302. Next, voltage to be applied to the substrate of the device-under-test 200 on which the field effect transistors are provided is controlled so that the leak current comes to a predetermined value in a voltage control step S304. It is preferable to always carry out the processes of Steps S304 and S304 during the test.

Then, while keeping the power-supply current at the predetermined value, the power-supply current inputted to the device-under-test 200 is measured in a power-supply current measuring step S306. After measuring the power-supply current, it is judged whether or not the measurement has been finished for all of the test patterns to be applied to the device-under-test 200 and when there exists a non-measured test pattern, a next test pattern is generated in Step S300 and the processes of Steps S300 through S306 are repeated.

When the measurement is finished for all of the test patterns, the measured values of the power-supply current is lined up as explained in FIG. 3B in a lining up step S310. Then, the lined up measured result of the power-supply current is second-order differentiated to detect peaks of the differential values in a peak detecting step S312 as explained in FIG. 4. It is then judged whether or not the device-under-test 200 is defect-free based on the peaks of the differential values in a judging step S314.

Figure 6:
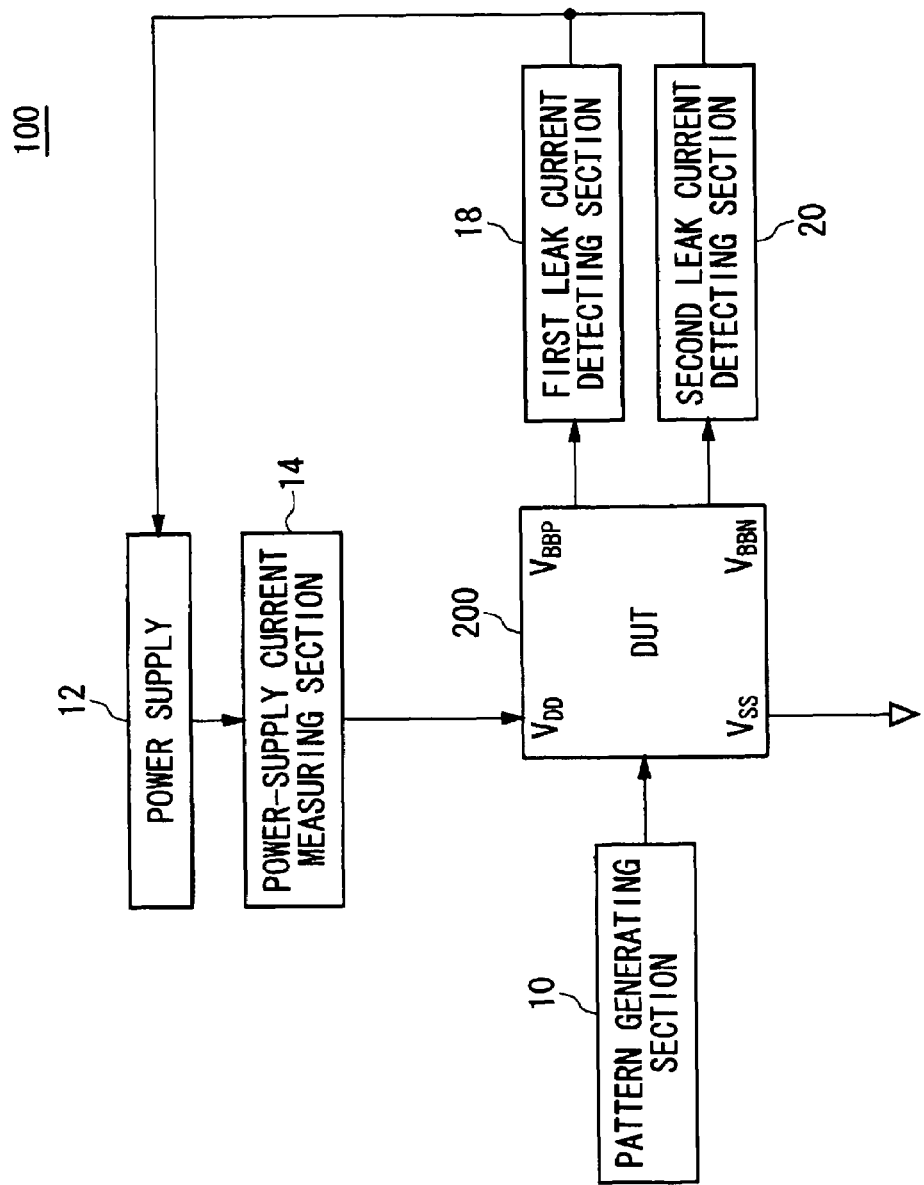
FIG. 6 is a diagram showing another exemplary configuration of the testing apparatus 100.

FIG. 6 is a diagram showing another exemplary configuration of the testing apparatus 100. The testing apparatus 100 of this example has the pattern generating section 10, the power supply 12, the power-supply current measuring section 14, the first leak current detecting section 18 and the second leak current detecting section 20.

The pattern generating section 10, the power-supply current measuring section 14, the first leak current detecting section 18 and the second leak current detecting section 20 in this example have the same functions with the pattern generating section 10, the power-supply current measuring section 14, the first leak current detecting section 18 and the second leak current detecting section 20 explained in connection with FIG. 1.

The power supply 12 supplies power for driving the device-under-test 200. The power supply 12 of this example controls a value of power-supply voltage applied to the device-under-test 200 so as to keep leak current detected by the first and second leak current detecting sections 18 and 20 at a predetermined value. Such configuration also allows the testing apparatus 100 to accurately measure the power-supply current by reducing an influence of the leak current in the field effect transistors contained in the device-under-test 200.

Figure 7:
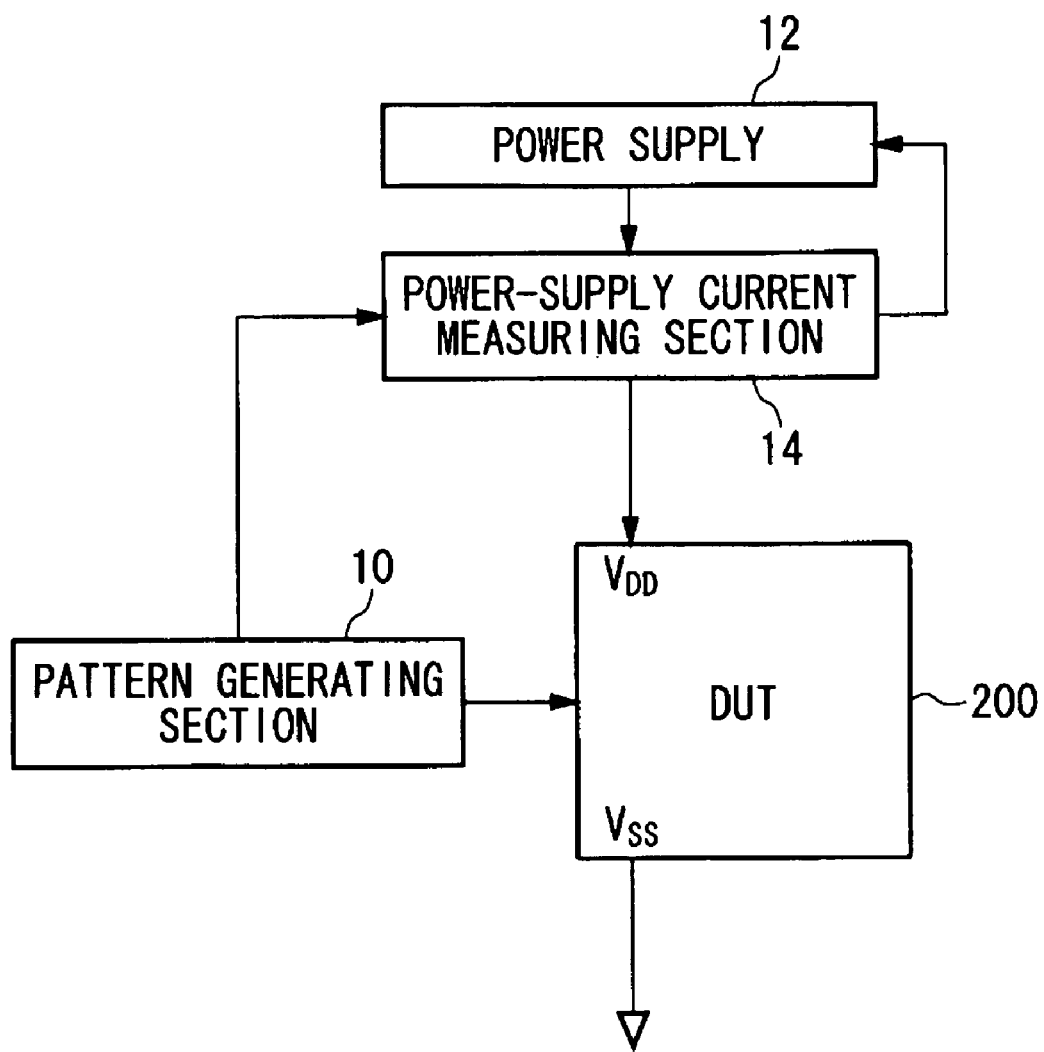
FIG. 7 is a diagram showing a still other exemplary configuration of the testing apparatus 100.

FIG. 7 is a diagram showing a still other exemplary configuration of the testing apparatus 100. The testing apparatus 100 has the pattern generating section 10, the power supply 12 and the power-supply current measuring section 14. The power supply 12 supplies power for driving the device-under-test 200 in the same manner with the power supply 12 explained in connection with FIG. 1.

The pattern generating section 10 sequentially generates and supplies a plurality of test patterns to be supplied to the device-under-test 200 in the same manner with the pattern generating section 10 explained in connection with FIG. 1. The pattern generating section 10 also generates a reference test pattern of a predetermined pattern and supplies it to the device-under-test 200 every time when it supplies a predetermined number of test patterns to the device-under-test 200. At this time, preferably the pattern generating section 10 informs of that the reference test pattern has been supplied to the device-under-test 200. The reference test pattern may be a reset pattern for initializing a state of each element of the device-under-test 200.

The power-supply current measuring section 14 measures the power-supply current inputted to the device-under-test 200 every time when each test pattern is applied. The power-supply current measuring section 14 also measures the power-supply current inputted to the device-under-test 200 when the reference test pattern is supplied to the device-under-test 200.

Then, the power-supply current measuring section 14 controls the power-supply voltage supplied from the power supply 12 to the device-under-test 200 so that the power-supply current supplied to the device-under-test 200 corresponding to the reference test pattern comes to a predetermined value. For example, a value of power-supply current corresponding to the first reference test pattern supplied to the device-under-test 200 is set as a reference value and the power-supply current measuring section 14 controls the power-supply voltage so that the power-supply current coincides with the reference value every time when the reference test pattern is supplied to the device-under-test 200. The power-supply current measuring section 14 may control the power-supply voltage based on the measured power-supply current every time when it receives information that the reference test pattern has been supplied to the device-under-test 200 from the pattern generating section 10.

Such operation allows the testing apparatus 100 to detect the fluctuation of the leak current caused by external factors such as temperature change by applying the reference test pattern to the device-under-test 200 per predetermined period of time and by measuring the power-supply current when the operation state of the device-under-test 200 is put into a predetermined state. Then, it can control the leak current caused by the external factors to be a constant value by controlling the power-supply voltage so that the power-supply current comes to a predetermined value.

In the state in which such control is made, i.e., in the state in which the power supply 12 keeps the power-supply voltage controlled by the power-supply current measuring section 14, the pattern generating section 10 inputs the test patterns to the device-under-test 200 and the power-supply current measuring section 14 measures the power-supply current supplied to the device-under-test 200 corresponding to the test pattern. It allows the testing apparatus 100 to measure the power-supply current from which the influence of the fluctuation of the leak current caused by the external factors has been eliminated.

Then, the power-supply current measuring section 14 measures whether or not the device-under-test 200 is defect-free based on the power-supply current measured corresponding to the respective test patterns. The method for judging whether or not the device-under-test 200 is defect-free is the same with that of the power-supply current measuring section 14 explained in connection with FIG. 1. The testing apparatus 100 of the present embodiment is also capable of accurately judging whether or not the device-under-test 200 is defect-free by eliminating the fluctuation of the leak current caused by the external factors.

The pattern generating section 10 may also alternately generate normal test patterns and reference test patterns and may supply them to the device-under-test 200. In this case, the measurement can be made more accurately because the fluctuation of the leak current is eliminated every time when the power-supply current corresponding to the each test pattern is measured.

Figure 8:
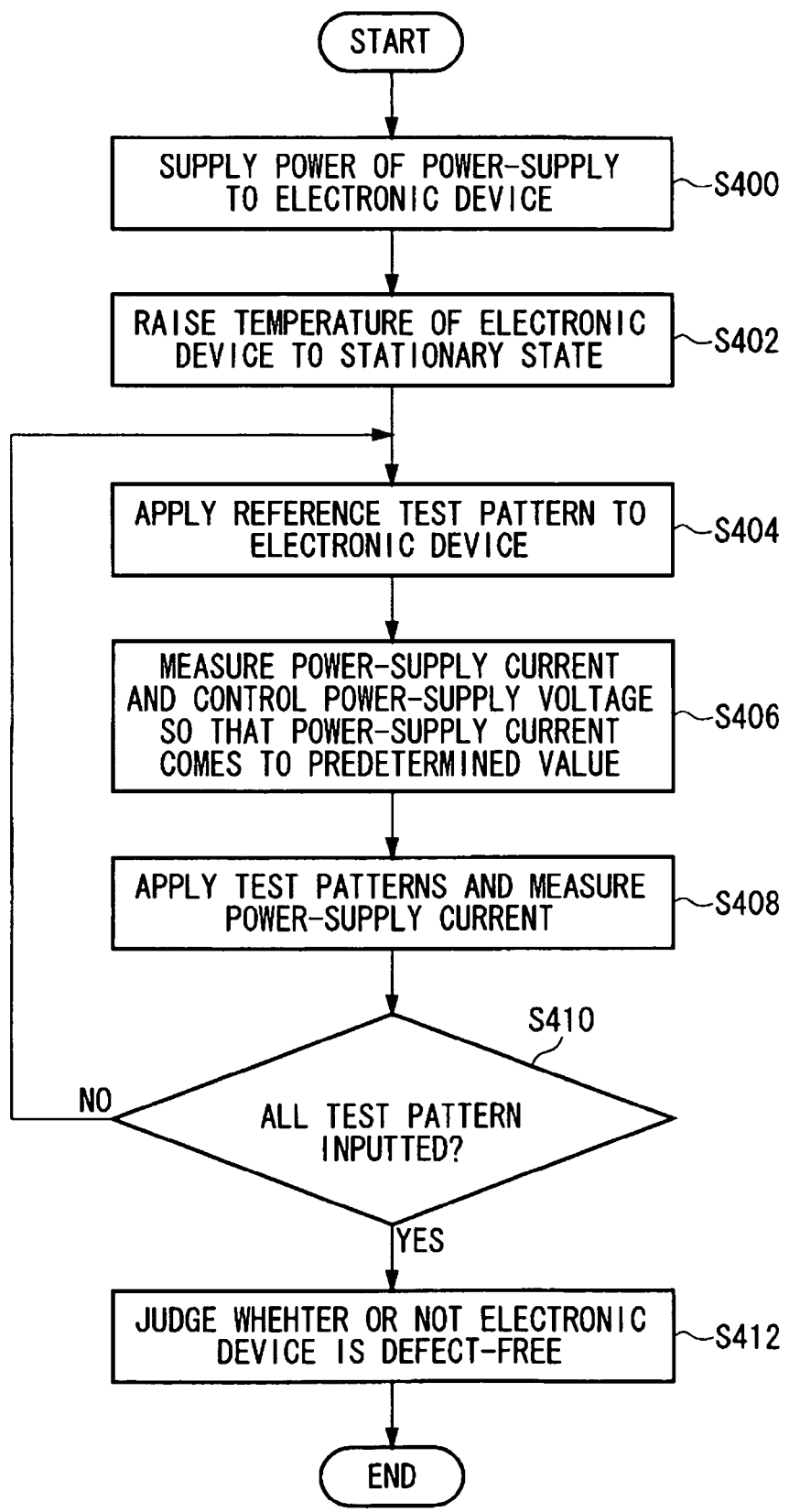
FIG. 8 is a flowchart showing another exemplary testing method.

FIG. 8 is a flowchart showing another exemplary testing method for testing the device-under-test 200. The device-under-test 200 may be tested by this testing method in the same manner with the method explained in FIG. 8.

At first, power for driving the device-under-test 200 is supplied in a power supplying step S400. Next, temperature of the device-under-test 200 is raised to a stationary state in a temperature control step S402. For example, the pattern generating section 10 repeatedly inputs adequate test patterns to the device-under-test 200 to raise the temperature of the device-under-test 200.

Next, a reference test pattern of a predetermined pattern is generated in a reference test pattern generating step S404. Then, the power-supply current when the reference test pattern is supplied to the device-under-test 200 is measured in a reference current measuring and power-supply voltage control step S406. Still more, the power-supply voltage generated in Step S400 is controlled so that the measured power-supply current comes to a predetermined value in Step S406.

Next, the test pattern to be supplied to the device-under-test 200 is applied and the power-supply current at that time is measured in a pattern generating and power-supply current measuring step S408. Then, when the power-supply current has not been measured for all of the test patterns to be applied, the processes of Steps 404 through S408 are repeated and when the power-supply current has been measured for all of the test patterns, it is judged whether or not the device-under-test 200 is defect-free based on the measured power-supply current in Step S412.

Figure 9:
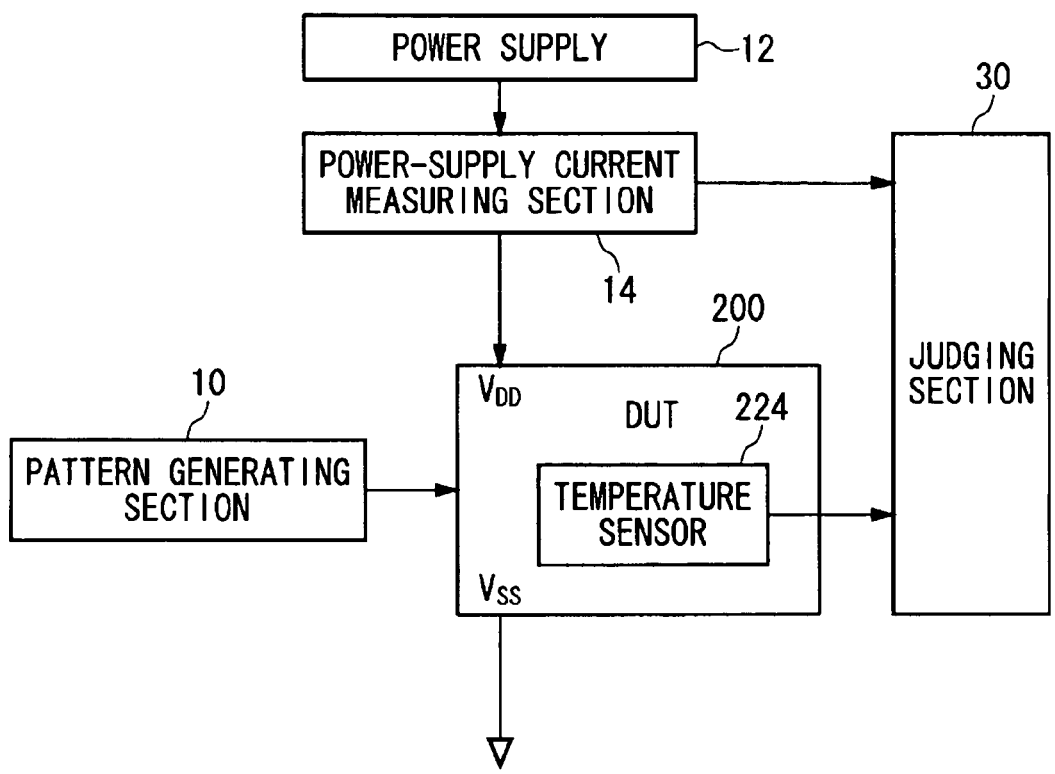
FIG. 9 is a diagram showing one exemplary configuration of the testing apparatus 100 according to the embodiment of the invention.

FIG. 9 is a diagram showing another exemplary configuration of the testing apparatus 100 according to the embodiment of the invention. The testing apparatus 100 of this example obtains temperature of an internal circuit of the device-under-test 200 outputted out of a temperature sensor 224 provided within the device-under-test 200. The temperature sensor 224 may be an element whose characteristics change due to temperature such as a diode.

The testing apparatus 100 has the pattern generating section 10, the power supply 12, the power-supply current measuring section 14 and a judging section 30. The pattern generating section 10, the power supply 12 and the power-supply current measuring section 14 may have the same or similar functions with the pattern generating section 10, the power supply 12 and the power-supply current measuring section 14 explained in connection with FIGS. 1 through 8.

The pattern generating section 10 generates a setting vector that sets the internal circuit of the device-under-test 200 into a predetermined stage and supplies it to the device-under-test 200. For example, the pattern generating section 10 generates a setting vector that sets a state of transistors of the device-under-test 200. The pattern generating section 10 may generate a setting vector that turns on all transistors of the device-under-test 200 or may generate a setting vector that turns off all transistors. The pattern generating section 10 may also continuously apply patterns to the device-under-test 200 before applying the setting vector to the device-under-test 200 and may apply the setting vector after when internal temperature of the device-under-test 200 reaches to the stationary state.

The power-supply current measuring section 14 measures static power-supply current supplied from the power supply 12 to the device-under-test 200 when the device-under-test 200 is set into the predetermined state by the setting vector. For example, the pattern generating section 10 may informs the power-supply current measuring section 14 of that the setting vector has been applied and the power-supply current measuring section 14 may measure the static power-supply current in response to that information.

The judging section 30 obtains the temperature of the device-under-test 200 from the temperature sensor 224 provided within the device-under-test 200 and judges whether or not the device-under-test 200 is defect-free based on the static power-supply current measured by the power-supply current measuring section 14 and the temperature of the device-under-test 200. For example, the judging section 30 corrects the static power-supply current measured by the power-supply current measuring section 14 based on the obtained temperature and compares it with an expected value given in advance.

Such control allows the judging section 30 to accurately judge whether or not the device-under-test 200 is defect-free by reducing the influence of leak current that varies corresponding to the temperature of the device-under-test 200.

Sub-threshold leak current in the device-under-test 200 depends on the temperature of the device-under-test 200, a gate capacity of the transistor of the device-under-test 200, a substrate capacity and others in general. The gate capacity and the substrate capacity depend on process parameters in generating the device-under-test 200. Therefore, the judging section 30 may use different correction factors per lot and per wafer of the device-under-test 200. It is possible to set the correction factor in advance by applying the setting vector to a device generated through the same process with the device-under-test 200, by measuring static power-supply current while changing temperature and by detecting fluctuation of the static power-supply current to the temperature for example.

The device-under-test 200 may be provided with one temperature sensor 224 approximately at the center thereof. Or, a plurality of temperature sensors 224 may be disposed homogeneously within the device-under-test 200. In this case, the judging section 30 makes the correction by using temperature detected by the temperature sensors 224 provided in the vicinity of a circuit to be measured among temperatures detected by the plurality of temperature sensors 224.

Figure 10A:
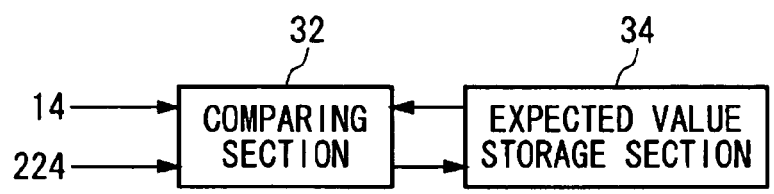
FIG. 10A is a diagram showing one exemplary configuration of a judging section 30.
Figure 10B:
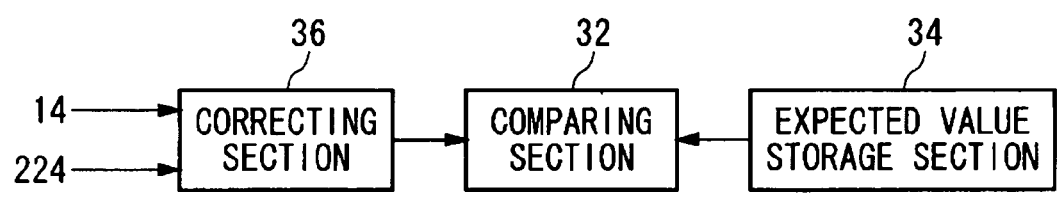
FIG. 10B is another exemplary configuration of the judging section 30.

FIGS. 10A and 10B are diagrams showing exemplary configurations of the judging section 30. The judging section 30 shown in FIG. 10A has a comparing section 32 and an expected value storage section 34. The comparing section 32 obtains the measured value of static power-supply current from the power-supply current measuring section 14 and the temperature of the device-under-test when the static power-supply current is measured from the temperature sensor 224. The expected value storage section 34 stores the expected value of the static power-supply current per temperature of the device-under-test 200.

The comparing section 32 detects the expected value corresponding to the temperature obtained from the temperature sensor 224 out of the expected value storage section 34 and compares the expected value with the measured value of the static power-supply current. When a difference between the expected value and the measured value of the static power-supply current does not fall within a range set in advance, the comparing section 32 judges that the device-under-test 200 is defective. Such configuration allows the testing apparatus 100 to accurately test the static power-supply current by reducing the influence of fluctuation of leak current caused by the temperature of the device-under-test 200.

The judging section 30 shown in FIG. 10B has the comparing section 32 and the expected value storage section 34. The expected value storage section 34 stores expected values of static power-supply current at temperatures set in advance. The correcting section 36 obtains a measured value of the static power-supply current from the power-supply current measuring section 14 and temperature of the device-under-test when the static power-supply current is measured from the temperature sensor 224. The correcting section 36 corrects the obtained static power-supply current based on the temperature of the device-under-test 200 when the static power-supply current is measured. For example, the correcting section 36 may store a correction factor corresponding to a difference between the temperature set in advance and the temperature during the measurement in advance. The correcting section 36 corrects the value of current obtained when the measurement is made at the temperature set in advance by multiplying the obtained static power-supply current with the correction factor corresponding to the difference between the temperature set in advance and the temperature during the measurement.

The comparing section 32 judges whether or not the device-under-test is defect-free by comparing the value of current calculated by the correcting section 36 with the expected value stored in the expected value storage section 34. Such configuration also allows the testing apparatus 100 to accurately test the static power-supply current by reducing the influence of fluctuation of the leak current caused by the temperature of the device-under-test 200.

Strictly speaking, the range in which the measured value is allowed with respect to the expected value must be varied per temperature of the device-under-test 200 in case of the configuration shown in FIG. 10A because current detected when the device-under-test 200 is defective also fluctuates due to the temperature of the device-under-test 200. However, the comparison is made after correcting the value to the measured value at the temperature set in advance in case of the configuration shown in FIG. 10B, so that the single range at that temperature may be used as the range in which the measured value is allowed with respect to the expected value. Therefore, it enables the judging section 30 to more accurately judge whether or not the device-under-test 200 is defect-free.

Figure 11:
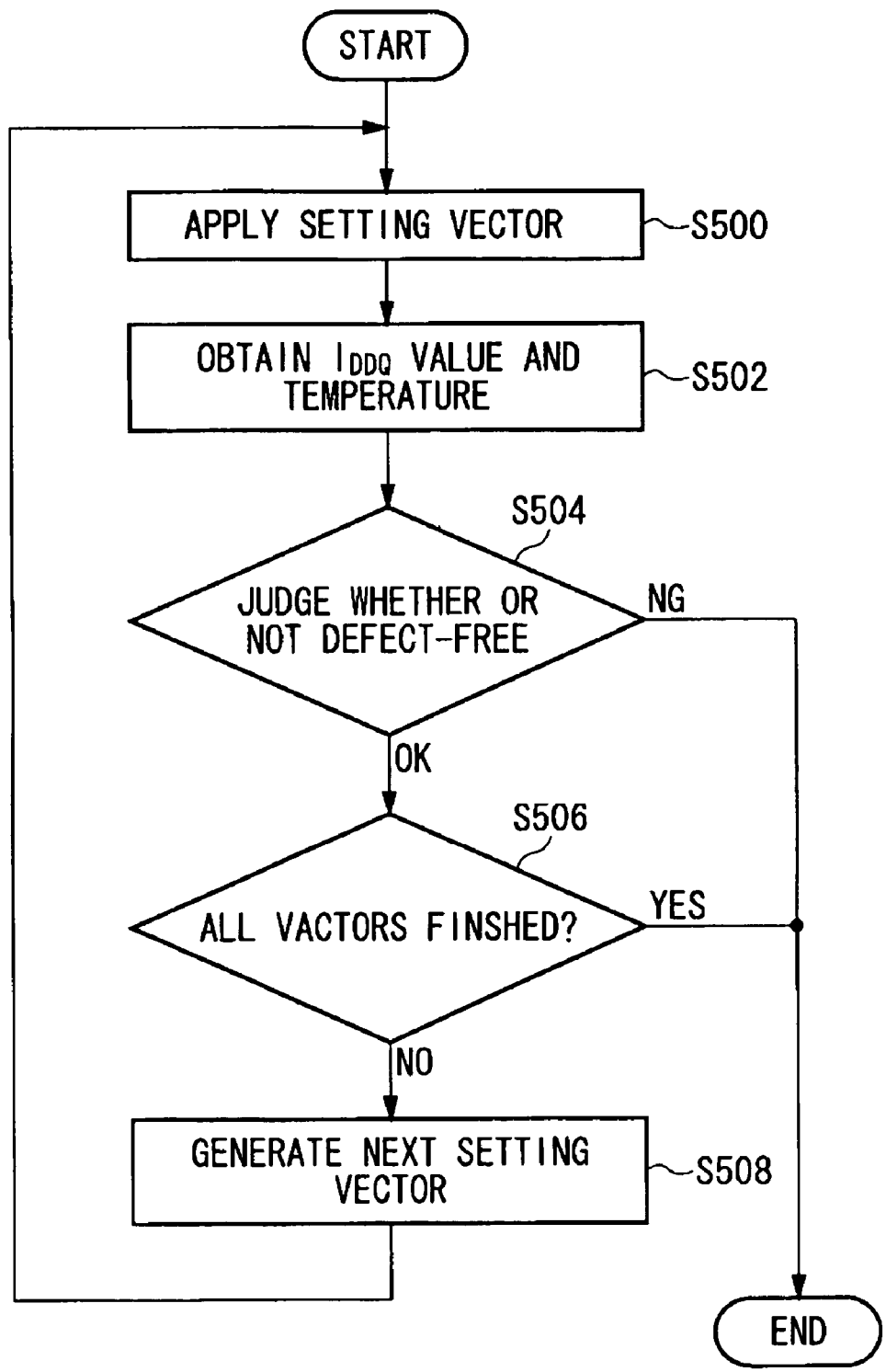
FIG. 11 is a flowchart showing another exemplary testing method for testing the device-under-test 200.

FIG. 11 is a flowchart showing another exemplary testing method for testing the device-under-test 200. The device-under-test 200 is tested by this testing method in the same manner with the methods explained in FIGS. 9 and 10.

At first, a setting vector set in advance is applied to the device-under-test 200 in Step S500. Next, the testing apparatus 100 obtains static power-supply current and temperature of the device-under-test 200 in the state in which the setting vector is applied in Step S502. Then, the testing apparatus 100 judges whether or not the device-under-test 200 is defect-free based on the static power-supply current, the temperature and a given expected value in Step S504. When the testing apparatus 100 judges that the device-under-test 200 is defective, it ends the test.

When the testing apparatus 100 judges that the device-under-test 200 is defect-free, it judges whether or not the measurement has been done for all setting vectors to be tested in Step S506. When the measurement for all of the setting vectors has been done, the testing apparatus 100 ends the test. When the measurement has not been done for all of the setting vectors, the testing apparatus 100 generates a setting vector to be applied next in Step S508 and repeats the processes from Step S500 to Step S506.

Such test allows the device-under-test 200 to be accurately tested whether or not it is defect-free by reducing the influence of leak current that varies corresponding to temperature of the device-under-test 200 for all of the setting vectors.

Although the invention has been described by way of the exemplary embodiments, it should be understood that those skilled in the art might make many changes and substitutions without departing from the spirit and scope of the invention.

It is obvious from the definition of the appended claims that the embodiments with such modifications also belong to the scope of the invention.

As it is apparent from the above description, the invention allows the device-under-test to be accurately judged whether or not it is defect-free by reducing the influence of the leak current that varies corresponding to temperature of the device-under-test.

What is claimed is:

1. A testing apparatus for judging whether or not a device-under-test is defect-free based on static power-supply current of the device-under-test, comprising:
    a power supply for supplying power for driving said device-under-test to said device-under-test;
    a pattern generating section for supplying setting vectors for setting a circuit of said device-under-test into a predetermined state to said device-under-test;
    a power-supply current measuring section for measuring said static power-supply current supplied from said power supply to said device-under-test when said device-under-test is set into said predetermined state by said setting vectors; and
    a judging section for obtaining temperature of said device-under-test from a temperature sensor provided within said device-under-test to judge whether or not said device-under-test is defect-free based on said static power-supply current measured by said power-supply current measuring section and the temperature of said device-under-test.

2. The testing apparatus as set forth in claim 1, wherein said judging section has
    an expected value storage section for storing expected values of said static power-supply current given per temperature of said device-under-test; and
    a comparing section for judging whether or not said device-under-test is defect-free by comparing said measured static power-supply current with said expected value corresponding to the temperature of said device-under-test when said static power-supply current is measured.

3. The testing apparatus as set forth in claim 1, wherein said judging section has
- an expected value storage section for storing expected values of said static power-supply current at temperature set in advance;
- a correcting section for correcting said measured static power-supply current to a current value obtained when measured at said temperature set in advance based on the temperature of said device-under-test when said static power-supply current is measured; and
- a comparing section for judging whether or not said device-under-test is defect-free by comparing the current value calculated by said correcting section with said expected value.

4. A testing method for judging whether or not a device-under-test is defect-free based on static power-supply current of the device-under-test, comprising:
- a power supplying step of supplying power for driving said device-under-test to said device-under-test;
- a pattern generating step of supplying setting vectors for setting a circuit of said device-under-test into a predetermined state to said device-under-test;
- a power-supply current measuring step of measuring said static power-supply current supplied from said power-supply to said device-under-test when said device-under-test is set into said predetermined state by said setting vectors; and
- a judging step of obtaining temperature of said device-under-test from a temperature sensor provided within said device-under-test to judge whether or not said device-under-test is defect-free based on said static power-supply current measured in said power-supply current measuring step and the temperature of said device-under-test.

* * * * *